United States Patent
Kim et al.

(10) Patent No.: US 6,383,949 B1
(45) Date of Patent: May 7, 2002

(54) METHOD OF DEPOSITING AN OZONE-TEOS OXIDE FILM TO ELIMINATE ITS BASE MATERIAL DEPENDENCE, AND APPARATUS FOR FORMING SUCH A FILM AT SEVERAL DIFFERENT TEMPERATURES

(75) Inventors: Do-hyung Kim, Seoul; Dong-geun Na, Suwon, both of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/598,254

(22) Filed: Jun. 21, 2000

(30) Foreign Application Priority Data

Jun. 24, 1999 (KR) .............................. 99-23949

(51) Int. Cl.[7] .............................. H01L 21/31
(52) U.S. Cl. .................. 438/778; 438/622; 438/789
(58) Field of Search ................ 438/778, 787, 438/789, 622, 623, 624

(56) References Cited

U.S. PATENT DOCUMENTS 5,563,104 A * 10/1996 Jang et al. ................. 438/622

FOREIGN PATENT DOCUMENTS

EP 893824 * 1/1999

OTHER PUBLICATIONS

K. Fujino et al., "Surface Modification of Base Materials for TEOS/03 Atmospheric Pressure Chemical Vapor Deposition," J. Electrochem. Soc. vol. 139, No. 6, Jun. 1992.

* cited by examiner

Primary Examiner—Caridad Everhart
(74) Attorney, Agent, or Firm—Volentine Francos, PLLC

(57) ABSTRACT

The present invention resides in a method of and apparatus suitable for forming an $O_3$-TEOS oxide film on a substrate. First, the $O_3$-TEOS oxide is deposited on an underlying film at such a high temperature that the morphology of the first $O_3$-TEOS oxide film is not dependent on the material of the underlying film. Then, the $O_3$-TEOS oxide is deposited at a substantially lower temperature so that the deposition can occur at a high rate. The apparatus includes at least two susceptors or heaters, which are configured or can be controlled to produce the different temperatures under which the depoition occurs. Because the $O_3$-TEOS film is formed at least two different temperatures, i.e., a high temperature and a low temperature, the base material dependence of the $O_3$-TEOS film is eliminated and yet a high level of productivity can be sustained.

10 Claims, 6 Drawing Sheets

METHOD OF DEPOSITING AN OZONE-TEOS OXIDE FILM TO ELIMINATE ITS BASE MATERIAL DEPENDENCE, AND APPARATUS FOR FORMING SUCH A FILM AT SEVERAL DIFFERENT TEMPERATURES

BACKGROUND OF THE INVENTION

1. Field of the Invention

The present invention relates to a method of forming an ozonetetraethylorthosilicate ($O_3$-TEOS) oxide film, and to apparatus for depositing material, such as $O_3$-TEOS oxide, on a substrate.

2. Description of the Related Art

As of recent, TEOS oxide films are being widely used as interlayer dielectric films and planarization films of semiconductor devices. $O_3$-TEOS oxide films, which comprise a TEOS film formed using ozone ($O_3$) as a catalyst, are also being widely used for such applications.

General TEOS films have a step coverage superior to that of conventional exhibits a smooth shape at the edges of an underlying pattern layer and excels in filling the gap between adjacent portions of the pattern layer. Moreover, $O_3$-TEOS films have excellent characteristics when serving as planarization films. However, when TEOS films are formed on an underlying film, they may exhibit an abnormal growth pattern or poor surface characteristics, depending on the type of material or pattern of the underlying film. That is, the dependence of the quality of $O_3$-TEOS films upon their underlying films includes pattern dependence (or pattern sensitivity) and base material dependence. Pattern dependence refers to the fact that $O_3$-TEOS deposits relatively slowly over dense patterns and much quicker over sparse patterns; consequently, an $O_3$-TEOS film typically will have a non-uniform thickness when deposited over an underlying pattern layer. Base material dependence refers to the fact that $O_3$-TEOS can grow irregularly or acquire an excessive surface roughness depending on the material of its underlying film, independently of the density of patterns of the underlying film.

The present invention particularly relates to the base material dependence of $O_3$-TEOS films. The base material dependence of $O_3$-TEOS films will now be described in further detail with reference to FIG. 1.

Figure 1:
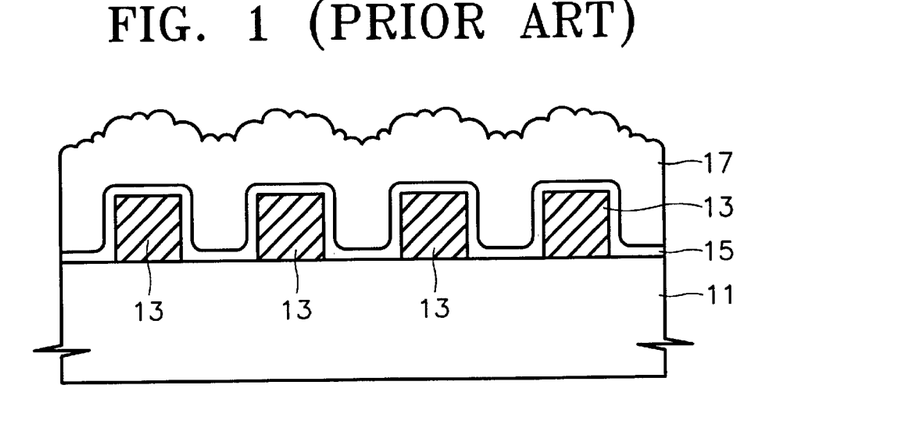
FIG. 1 is a cross-sectional view of an intermediate product of a semiconductor device illustrating the base material dependence of an $O_3$-TEOS oxide film.

As shown in this figure, a layer 13 having a predetermined pattern is formed on a substrate 11 (a silicon substrate or a layer of material already formed on a substrate). A lower film 15 of a material for which $O_3$-TEOS exhibits base dependence is then formed on the resultant substrate. An $O_3$-TEOS film 17 is then formed on the lower film 15. As shown in FIG. 1, the $O_3$-TEOS film 17 forms unevenly on the lower film, and has an extremely rough surface due to abnormal growth. Here, it must be noted that the high surface roughness is not due to the pattern of the underlying layer 13 but due to the material of the lower film 15 on which the $O_3$-TEOS film 17 is formed. In fact, even if the $O_3$-TEOS film 17 were formed on a flat underlying layer 13 instead of one having a stepped configuration as shown in FIG. 1, only the pattern dependence of the $O_3$-TEOS film 17 would be reduced and the film would still exhibit base dependence problems similar to those described above. Films for which an $O_3$-TEOS film has base material dependence include a thermal oxide film, a high temperature oxide (HTO) film, a nitride film formed by chemical vapor deposition (CVD), and a TEOS film formed by plasma enhanced CVD (PE-CVD). Finally, it should be noted that the cause of base material dependence is assumed to be some characteristic of the underlying film, e.g., hydrophilicity/hydrophobicity, or the existence of an ON group, but such a cause has not yet been ascertained with a high degree of certainty.

Regardless, base material dependence can be eliminated by the following three proposed methods.

First, a lower film 15 of a material for which the $O_3$-TEOS film 17 has no base material dependence can be formed on the substrate just prior to the depositing of the $O_3$-TEOS film 17. For example, this material can be an oxide deposited by PE-CVD using a silane gas as a source gas, or a nitride deposited by PE-CVD (see U.S. Pat. No. 5,804,498 entitled "Method Of Making An Underlayer To Reduce Pattern Sensitivity Of Ozone-TEOS"). Although this patent refers to pattern sensitivity, strictly speaking, what has been eliminated by the nitride or oxide formed by PE-CVD is base material dependence. However, since the PE-CVD oxide or nitride is formed by plasma deposition, the quality of its material is poor. Furthermore, PE-CVD is a complicated method to perform, and it is difficult to produce an oxide or nitride layer having a uniform thickness using PE-CVD. Therefore, the use of these materials as the film underlying the $O_3$-TEOS film makes for unreliable semiconductor devices.

Figure 2:
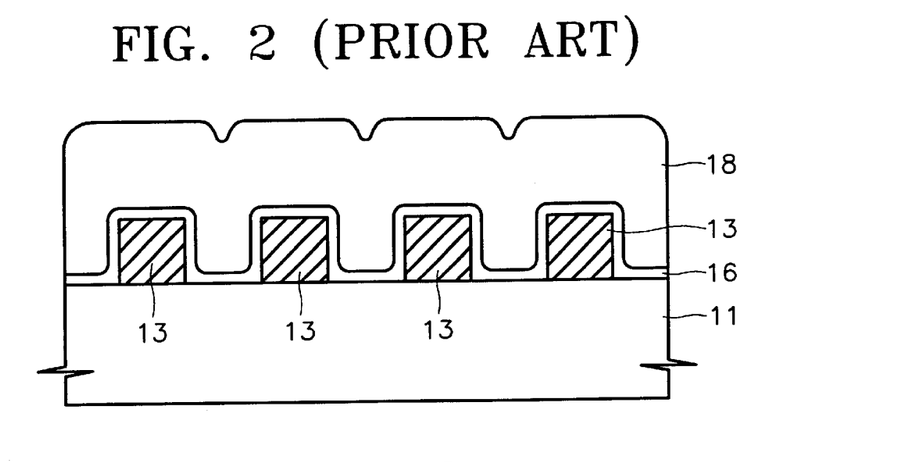
FIG. 2 is a similar view illustrating a state in which the base material dependence of an $O_3$-TEOS oxide film has been reduced using a conventional method.

Secondly, the underlying film on which the $O_3$-TEOS film has base material dependence may be plasma-treated for a predetermined period of time under an $N_2$ or $NH_3$ gas atmosphere, before the $O_3$-TEOS is deposited thereon (see K. Fujino, Y. Nishimoto, N. Tokumasu, and K. Maeda, "Surface Modification of Base Materials for TEOS/$O_3$ Atmospheric Pressure Chemical Vapor Deposition", J. Electrochem. Soc., Vol. 139, No. 6, June 1999). The surface roughness of the $O_3$-TEOS film 18 is significantly kept in check in this way, as shown in FIG. 2. However, plasma treatment is another complex processing method, and detracts from the productivity of the overall manufacturing process.

Thirdly, the $O_3$-TEOS film may be deposited on the substrate at a high temperature. That is, $O_3$-TEOS films are typically formed at about 400° C. However, it has been shown that an $O_3$-TEOS film formed at about 500° C. has an excellent surface roughness. Unfortunately, this method is problematic in that the deposition rate is very slow and thus the method is associated with poor productivity. For example, when $O_3$-TEOS is deposited on a bare silicon substrate at 400° C., the deposition rate is approximately 800 Å/min, but at 500° C., the deposition rate is only about 150 Å/min. Therefore, this third method is not suitable for mass production.

SUMMARY OF THE INVENTION

Accordingly, a first object of the present invention is to provide a simple method of depositing $O_3$-TEOS, in which base material dependence is eliminated, and film quality and productivity are guaranteed.

The second object of the present invention is to provide a deposition apparatus which is particularly suitable for performing the above-described $O_3$-TEOS deposition method and can also be used to deposit other materials on a substrate.

To achieve the first object, the present invention provides a method of forming an $O_3$-TEOS oxide film which includes depositing a first portion of $O_3$-TEOS oxide on a lower film, at such a high temperature that the characteristics of the $O_3$-TEOS oxide film are not base material dependent on the lower film, and then depositing a second portion of $O_3$-TEOS oxide on the first portion of $O_3$-TEOS oxide at a low temperature which allows the deposition to occur at a high rate.

The temperature at which the first portion of the $O_3$-TEOS oxide film is formed is preferably within a range of 450 to 600° C., and the temperature at which the second portion of the $O_3$-TEOS oxide film is preferably within a range of 360 to 440° C. Also, such temperature conditions can be produced as a series step-wise temperature changes or as a continuously decreasing temperature.

Also, the deposition steps are preferably performed in situ to enhance productivity.

To achieve the second object, the present invention provides a deposition apparatus which includes at least two susceptors, each of which is configured to support a wafer on which a layer is to be formed and comprises a heater for heating the wafer, at least one shower head for directing source gases toward the wafers, and a robot arm for loading the susceptors with wafers, transferring the wafers between the susceptors, and unloading completed wafers from the susceptors. The temperature of at least one of the heaters can heat the wafer supported on its susceptor to a temperature different from that/those provided by the other heater/heaters.

To achieve the second object, the present invention also provides a deposition apparatus which includes a conveyor comprising at least one wafer tray configured to support a wafer and linearly movable in a horizontal direction along a conveyance path, at least-two wafer heaters fixed in place under the conveyance path and positioned relative to one another along the path of conveyance of the wafer tray, at least one shower head disposed over the conveyance path for supplying source gases of a material to be deposited on the wafers, and a robot arm for loading the at least one wafer tray with wafers and unloading the wafers from the wafer tray. Again, the temperature of at least one of the heaters can heat the wafer passing thereover to a temperature different from that/those provided by the other heater/heaters.

Accordingly, the deposition apparatus enable material to be deposited on a wafer at different temperatures, and as such, are effective in forming a high quality $O_3$-TEOS oxide film on a wafer with a high rate of production.

BRIEF DESCRIPTION OF THE DRAWINGS

The above and other objects, features and advantages of the present invention will become more apparent from the following detailed description of preferred embodiments thereof made with reference to the attached drawings, of which.

DETAILED DESCRIPTION OF THE PREFERRED EMBODIMENTS

<Formation of an $O_3$-TEOS Oxide Film>

Figure 3:
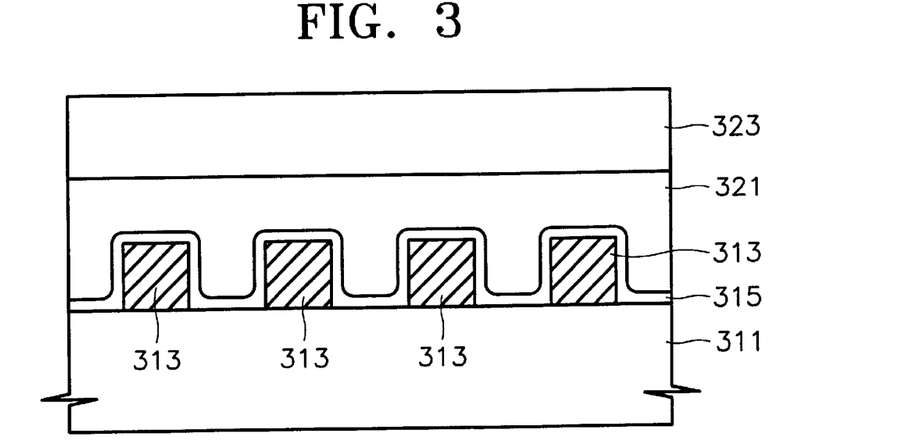
FIG. 3 is a cross-sectional view of an intermediate product of a semiconductor device illustrating an $O_3$-TEOS oxide film formed according to an embodiment of the present invention.

Referring to FIG. 3, a substrate 311 (which may include an interlayer dielectric layer having a transistor or the like formed therebelow) is prepared. Then, a patterned layer 313 and an underlying layer 315, whose upper film exhibits base material dependence with $O_3$-TEOS, are sequentially formed on the substrate 311. For example, the underlying layer 315 may comprise a high temperature oxide film or a nitride film formed by CVD. Here, the patterned layer 313 is used to illustrate, in turn, the use bf an $O_3$-TEOS oxide film in filling gaps. Even if only the underlying layer 315 is formed over the substrate 311, i.e. without the patterned layer 313, the present invention provides the same results as will be described below. Moreover, FIG. 3 shows the use of the $O_3$-TEOS film as a planarization film. However, the $O_3$-TEOS deposition method according to the present invention can be equally applied to the formation of an $O_3$-TEOS film used as an interlayer dielectric film between interconnections, or as an isolation film for filling a trench.

Next, a first $O_3$-TEOS film 321 is formed on the underlying layer 315 at a high temperature which causes the base material dependence to be eliminated. That is, when the $O_3$-TEOS film is formed at a temperature of 450 to 600° C., and preferably at about 500° C., the base material dependence is eliminated. Accordingly, a first, high quality $O_3$-TEOS film 321 having a nearly flat surface is produced.

Subsequently, a second $O_3$-TEOS film 323 is formed to a desired thickness on the first $O_3$-TEOS film 321 at a low temperature that is substantially less than the high temperature mentioned above, meaning at a temperature less than any temperatures existing as the result of incidental temperature variations occurring during the above-mentioned first deposition step. According to the present invention this low temperature is 360 to 440° C., and preferably about 400° C. Thus, the second $O_3$-TEOS film 323 is formed at a higher rate of deposition than the first $O_3$-TEOS film 321. And, because the second $O_3$-TEOS film 323 is formed on the first $O_3$-TEOS film 321 from which the base material dependence has been eliminated, the second $O_3$-TEOS film 323 exhibits a smooth surface morphology. Note, the first $O_3$-TEOS film 321 must have a certain thickness in order to eliminate the base material dependence of the second $O_3$-TEOS film 323, formed at a low temperature, above the underlying layer 315. The appropriate thickness of the first $O_3$-TEOS film 321 for this purpose depends on the height of the pattern layer 313, but in typical applications will be about 1000 to 3000 Å.

The depositing of each of the first and second $O_3$-TEOS films 321 and 323 is preferably performed in situ to increase productivity and prevent the wafer from being contaminated. This in-situ deposition is performed by a deposition apparatus, according to the present invention, including at least two susceptors or deposition chambers whose temperatures are respectively controlled to facilitate the depositing of the first and second $O_3$-TEOS films 321 and 323, respectively. In other words, the first $O_3$-TEOS film 321 is formed on one susceptor or in one deposition chamber, and the wafer is then transferred to another susceptor or deposition chamber and the second $O_3$-TEOS film 323 is formed thereat. Such a deposition apparatus according to the present invention will be described in more detail later on. The temperature is controlled by a heater installed in the respective susceptor or deposition chamber.

As described above, although the first and second $O_3$-TEOS films have been described as being formed at two temperatures, i.e., high (450 to 600° C.) and low (360 to 440° C.) temperatures, respectively, the method of the present invention may entail the forming of $O_3$-TEOS films at more than two distinct constant temperature conditions. Still further, the $O_3$-TEOS films can be formed by maintaining the deposition temperature at a high temperature for a predetermined period of time in an early stage, and then continuously lowering the temperature. Therefore, regardless of whether the method of the present invention is carried out in a plurality of discrete temperature stages or through a continuous adjustment of the temperature as described above, it may be inappropriate to describe a product formed by the method as comprising first and second $O_3$-TEOS films. That is, there may be no physical boundary between the first and second $O_3$-TEOS films 321 and 323. Thus, the present specification refers to the first and second $O_3$-TEOS films for the sake of ease of explanation, i.e. merely to differentiate between those portions of the $O_3$-TEOS film formed at significantly different temperatures.

Now the process conditions, other than temperature, and their effects on a typical method of forming an $O_3$-TEOS film according to the present invention will be described briefly.

First, with respect to ozone ($O_3$) concentration, ozone acts as a catalyst in the forming of $O_3$-TEOS films. Here, ozone is generally obtained from an ozonizer to which oxygen is supplied, and gas coming out of the ozonizer is a mixture of a large amount of oxygen and a small amount of ozone. Ozone concentration thus refers to the volume percentage of ozone in the gas mixture. In the case in which an $O_3$-TEOS film is deposited on an underlying film with which the $O_3$-TEOS film has no base material dependence, the greater the ozone concentration, the higher the deposition rate. Consequently, in this case, when the ozone concentration is high, a high quality film can be produced quickly. On the other hand, in the case in which an $O_3$-TEOS film is deposited on an underlying film with which the $O_3$-TEOS film has base material dependence, the greater the ozone concentration, the greater the abnormal growth of the $O_3$-TEOS becomes, i.e. the greater the surface roughness. Because the first $O_3$-TEOS film 321 is deposited according to the present invention at a temperature which eliminates its base material dependence, it is preferable that the first $O_3$-TEOS film 321 is deposited using a high concentration of ozone, for example, ozone of about 5 to 7% by volume of the ozone/oxygen gas mixture. Also, because the base material dependence has been eliminated from the second $O_3$-TEOS film 323 by the first $O_3$-TEOS film 321, the second $O_3$-TEOS film 323 is also preferably deposited using a high concentration of ozone.

With respect to the effects of pressure, in general, $O_3$-TEOS can be deposited on a substrate at atmospheric pressure. However, the lower the pressure (the pressure can be reduced below atmospheric pressure by a vacuum pump), the denser the $O_3$-TEOS film becomes. Hence, the $O_3$-TEOS film is preferably formed at a low pressure. That is, a pressure of about 400 to 700 Torr is suitable for providing an $O_3$-TEOS film of a desirable density.

The first and second $O_3$-TEOS films 321 and 323 deposited as described above may be thermally processed to eliminate humidity from the films and to densify the films. In this case, thermal processing occurs at a temperature of 750 to 1200° C., for a time of appropriately 30 minutes to 2 hours.

For the purposes of comparison, first and second $O_3$-TEOS films formed according to the present invention, and a single $O_3$-TEOS film formed at a temperature of 400° C., were both thermally processed. Subsequently, the material characteristics of the $O_3$-TEOS films were compared to each other on the basis of a wet etching thereof. First of all, the $O_3$-TEOS films according to the present intention and the $O_3$-TEOS film formed at only a temperature of 400° C. both exhibited etch rates of about 850 Å/minute using a BOE(Buffered Oxide Etchant). Also, the etch rates were almost that same—about 50 Å/minute—when etched with a hydrofluoric (HF) water solution formed of HF diluted by 100 times its amount with water. It is thus evident that the $O_3$-TEOS films according to the present invention possess the same material characteristic as the $O_3$-TEOS film formed at a single temperature.

<Deposition Apparatus>

FIGS. 4 through 8 show the preferred embodiments of deposition apparatus according to the present invention. In particular, these deposition apparatus can deposit the aforementioned first and second $O_3$-TEOS films in situ on a substrate. Moreover, these deposition apparatus, according to the present invention, are useful for depositing other suitable materials in situ at different temperatures (or at a single temperature).

Figure 4:
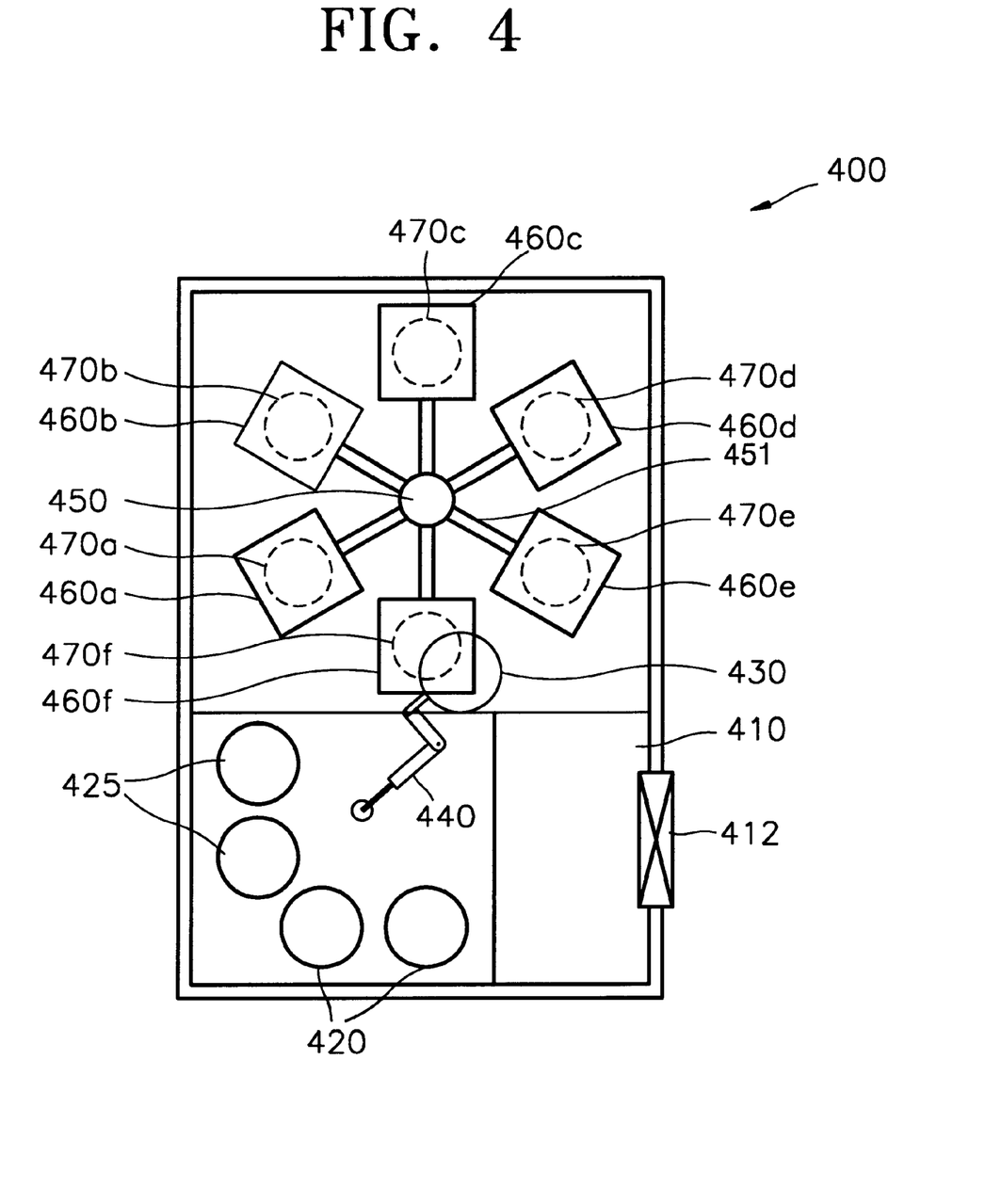
FIG. 4 is a schematic plan view of an embodiment of a deposition apparatus according to the present invention.
Figure 5:
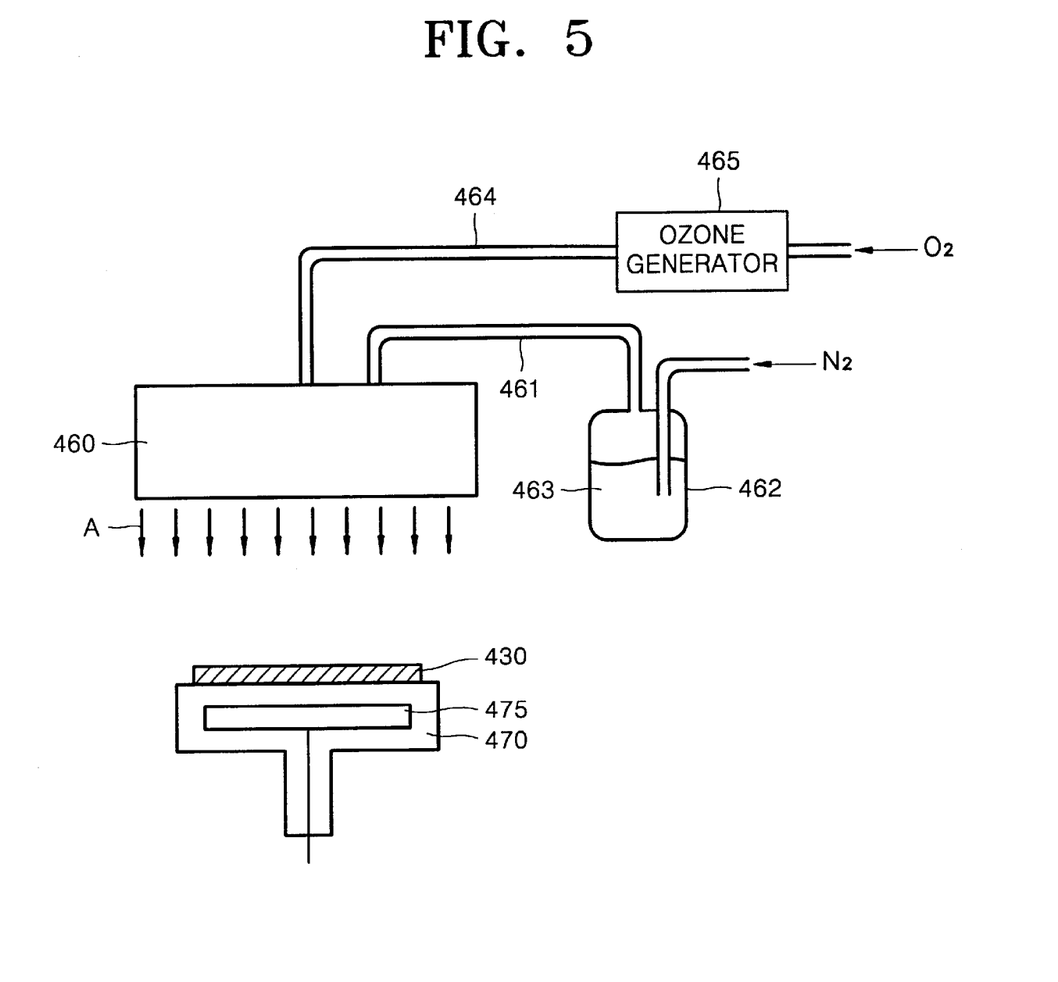
FIG. 5 is a side view of one of the deposition units of the apparatus shown in FIG. 4.

Referring now to FIGS. 4 and 5, the first embodiment of the deposition apparatus 400 according to the present invention includes a loading unit 410, a door 412, susceptors 470a through 470e, shower heads 460a through 460e, a robot arm 440, an exhaust outlet (not shown), and a vacuum pump (not shown). A wafer cassette having a plurality of wafers thereon enters the loading unit 410, and waits therein. The wafer cassette is transferred into and out of the deposition apparatus through the door 412. Wafers are loaded onto the susceptors 470a through 470e. A heater 475 is built in to each of the susceptors 470. The shower heads 460a through 460e are disposed over the susceptors 470a through 470e, respectively. Each of the shower heads 460 directs source gas, of a material to be deposited as a film, toward a wafer supported on the susceptor 470 disposed thereunder. The robot arm 440 loads the susceptors 470a through 470e with wafers, transfers wafers between the susceptors 470a through 470e, and transfers deposition-completed wafers from the susceptors 470a through 470e. Exhaust gases within the deposition apparatus 400 are exhausted through the exhaust gas outlet, and the pressure in the apparatus is controlled by the vacuum pump.

Each of the susceptors 470 and its corresponding shower head 460 constitute a deposition unit. The deposition units can be chambers which are closed from one another to allow the pressure therein to be individually controlled, or can be exposed to one another within the deposition apparatus 400. When the deposition units are sealed chambers, the pressures of the deposition units can be more easily controlled than those of exposed deposition units. The chamber-type deposition units are thus more useful in a deposition process which requires a high degree of vacuum. On the other hand, exposed deposition units are satisfactory for facilitating an $O_3$-TEOS film deposition process at atmospheric pressure or a slightly-low pressure, for example, at 400 Torr at most.

These deposition units are radially disposed around the central axis 450 of a turntable 451, and are mounted to the turntable so that they can rotate about the central axis 450. The robot arm 440 has a working envelope which encompasses the periphery of the turntable at a location at which the deposition unit 460*f*/470*f* resides, as seen in FIG. 4. Thus, when each of the deposition units reaches that position, the robot arm 440 loads the susceptor 470*f* with a wafer 430 from the wafer cassette 420, or grasps a deposition-completed wafer 430 from the susceptor 470*f* and loads the waiting wafer cassette 425 with the same.

The configuration of each of the deposition units is more clearly shown in FIG. 5. That is, the susceptor 470 comprises a built-in heater 475, and heats a wafer 430 supported thereon to an appropriate temperature. The shower head 460 is provided with source gases, of a material to be deposited as a film on the wafer 430, via gas supply lines 461 and 464, and sprays the source gases toward the wafer 430 as indicated by arrows A. The shower head 460 is preferably a separation-type of shower head having separate passages for the source gases in order to prevent two or more kinds of source gas from reacting with each other within the shower head 460. Such a reaction would otherwise cause a film to form within the shower head 460.

The shower head 460 shown in FIG. 5 sprays vaporized TEOS and a gas mixture of ozone and oxygen, which together act to form an $O_3$-TEOS film on the wafer 430. The vaporized TEOS is produced by forcing a carrier gas such as $N_2$ or He through a bubbler 462 which contains liquid TEOS 463. The TEOS vapor and the carrier gas are supplied together to the shower head 460 via the gas supply line 461. Ozone is generated in an ozone generator 465 and is supplied to the shower head 460 via the gas supply line 464.

The heaters 475 within the susceptors 470 of the deposition units may be configured or controlled to provide the same or different temperatures depending on the requirements of a deposition process. For example, the heaters 475 may each comprise a resistive heating element sized to produce the desired temperature. Alternatively, the heaters 475 may each comprise a resistive heating element, and a current source and/or controller for supplying to the element electric current of a magnitude which corresponds to the temperature to which the heater will heat the wafer. To facilitate the aforementioned $O_3$-TEOS film deposition method, the heater of at least one susceptor provides a high temperature, that is, 450 to 600° C., and the heaters of the other susceptors each provide a low temperature, that is, 360 to 440° C. In this case, a wafer is first loaded on a susceptor, and the first $O_3$-TEOS film 321 having a predetermined thickness is deposited on the wafer at the high temperature provided by the heater. After a predetermined time, the wafer is transferred onto a susceptor having a heater which provides a lower temperature, and the second $O_3$-TEOS film 323 is deposited on the wafer at the lower temperature.

Figure 6:
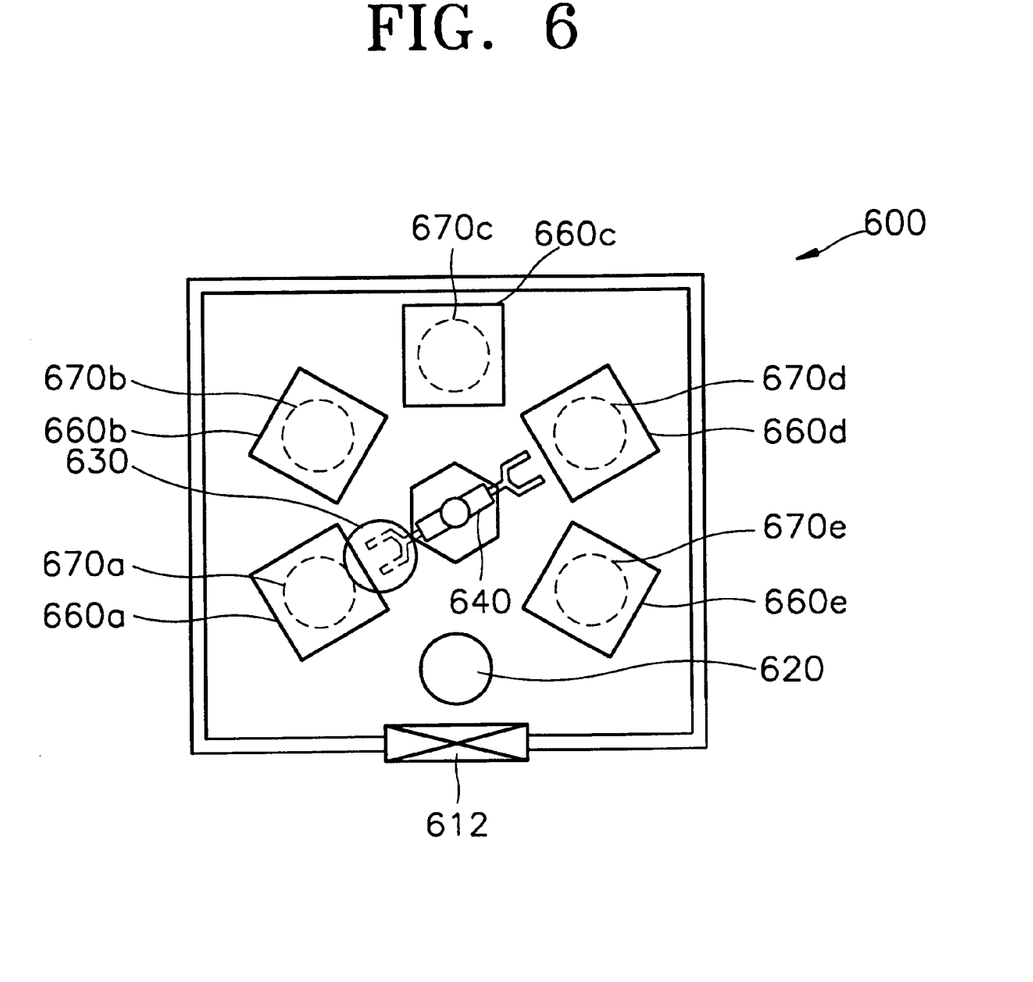
FIG. 6 is a schematic plan view of another embodiment of a deposition apparatus according to the present invention.

FIG. 6 shows a second embodiment of a deposition apparatus 600 according to the present invention. Each deposition unit 660*a* and 670*a*, 660*b* and 670*b*, and 660*e* and 670*e* of the deposition apparatus 600 shown in FIG. 6 has the same configuration as those of the first embodiment. And, as in the first embodiment, the heaters built in the susceptors 670*a* through 670*e* can provide the same or different temperatures. However, the deposition units are fixed at predetermined locations within the deposition apparatus 600, in contrast with the first embodiment. A robot arm 640 for loading or unloading a wafer 630 is disposed at the center of the deposition apparatus 600. The robot arm 640 rotates to transfer wafers between a wafer cassette 620 and each of the susceptors 670*a* through 670*e* which are arranged along the circumference of the working envelope of the robot arm 640, and to transfer wafers between the susceptors 670*a* through 670*e*.

Figure 7:
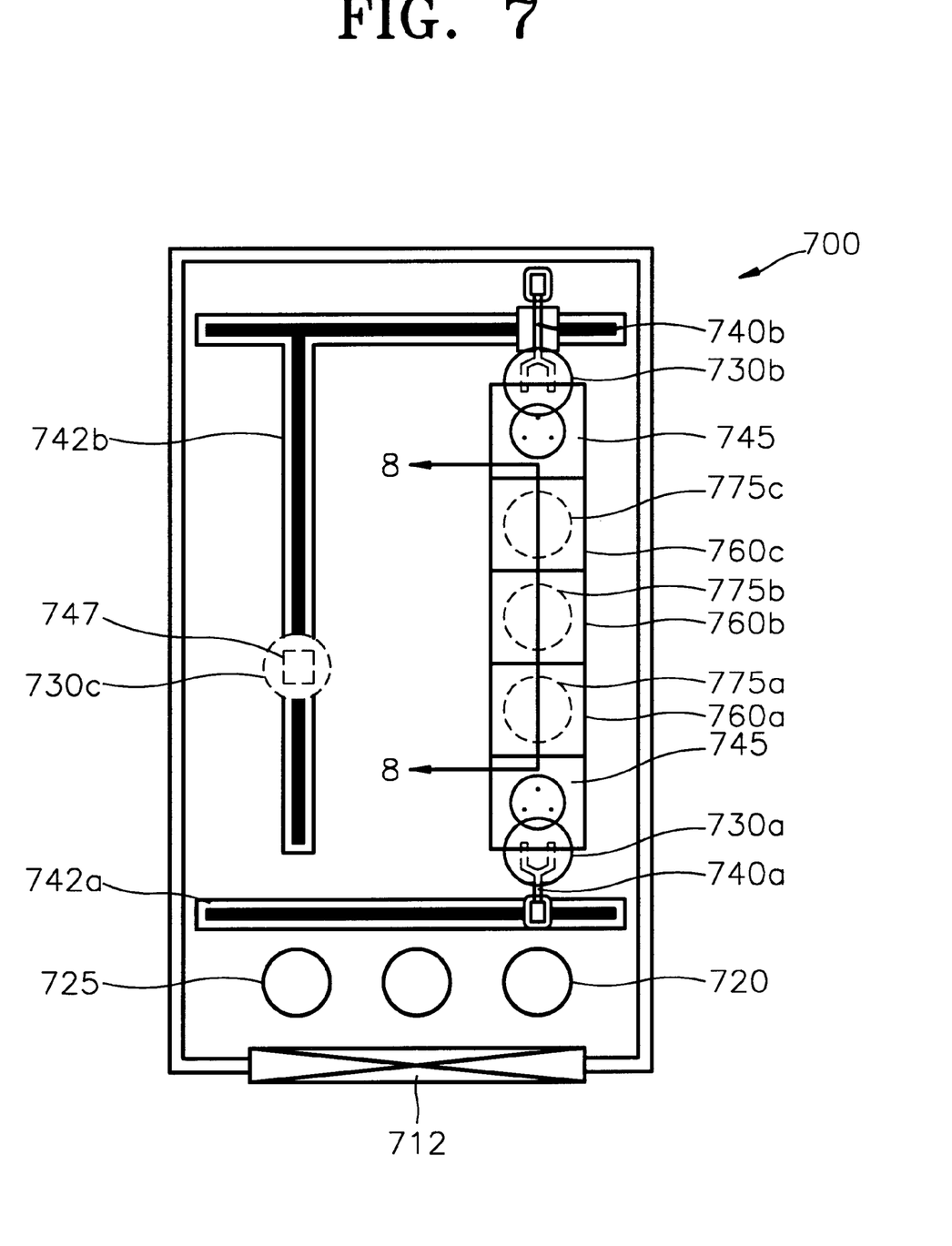
FIG. 7 is a schematic plan view of still another embodiment of a deposition apparatus according to the present invention.
Figure 8:
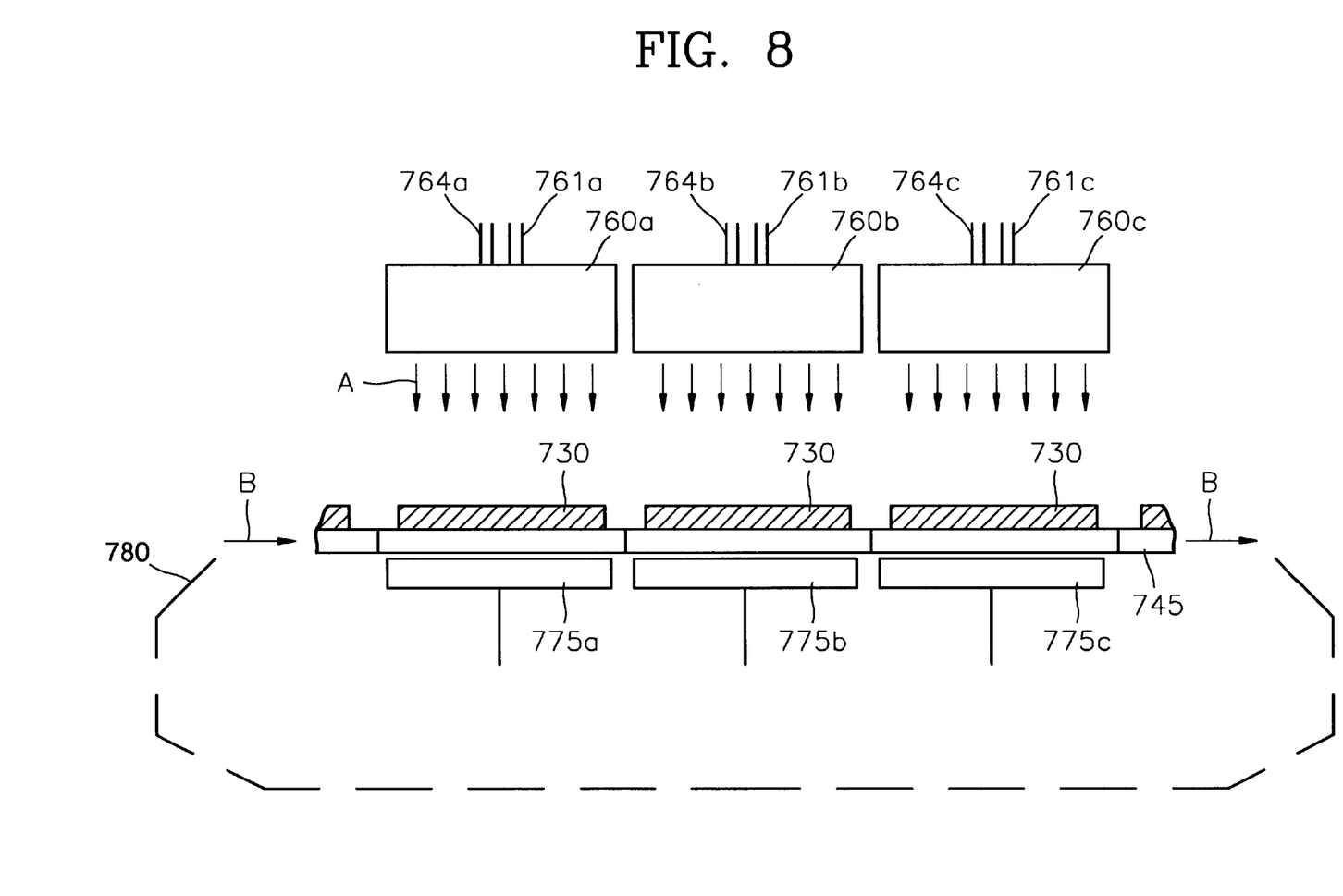
FIG. 8 is a sectional view of the deposition apparatus as taken along line 8–8 of FIG. 7.

FIGS. 7 and 8 show a third embodiment of a deposition apparatus 700 according to the present invention. The deposition apparatus 700 includes at least one wafer tray 745 for supporting a wafer 730 on which a respective film is to be formed, the wafer tray(s) being movable linearly along a horizontal conveyance path B, heaters 775*a* through 775*c* each disposed alongside the conveyance path B under the wafer tray(s) conveyed therealong, shower heads 760*a* through 760*c* disposed in a straight line opposite the heaters 775*a* through 775*c*, respectively, and above the wafer tray(s) conveyed along path B, robot arms 740*a* and 740*b* for loading the tray 745 with wafers 730*a* and unloading the tray 745, a returning robot 747 for returning a deposition-completed wafer 730*b*, and an exhaust outlet (not shown) and a vacuum pump (not shown). The robot arm 740*a* is engaged with a guide rail 742*a* so as to be slidable therealong. Similarly, the return robot 747 is slidable along respective portions of a guide rail 742*b*.

In operation, a wafer cassette 720 enters the apparatus 700 via a door 712 in the chamber wall thereof. The robot arm 740*a* transfers a wafer 730*a*, on which a film is to be formed, from the wafer cassette 720 to the wafer tray 745. A deposition-completed wafer 730*c* is returned to the working envelope of the robot arm 740*a* by the returning robot 747. The robot arm 740*a* is thus also responsible for loading the a wafer cassette 725, which is. waiting at a standby position, with the deposition-completed wafer 730*c*. The robot arm 740*b*, on the other hand, transfers the deposition-completed wafer 730*b* from the wafer tray 745 to the returning robot 747.

Referring now specifically to FIG. 8, source gases are supplied to the shower heads 760*a* through 760*c* via gas supply lines 761*a* and 764*a*, 761*b* and 764*b*, and 761*c* and 764*c*, respectively, in the same manner as shown in and described with reference to FIG. 5. The heaters 775*a* through 775*c* are configured or controlled to provide the same or different temperatures depending on the requirements of the film-forming process being executed by the apparatus 700. Also, the wafer trays 745 constitute the belt of a conveyor 780 (shown by the dashed lines) and so can move along the horizontal conveyance path indicated by arrows B. Thus, after film-forming material is deposited on the wafers 730 supported on the wafer trays 745, the wafers 730 can be moved in the direction indicated by arrows B, whereby loaded wafers 730 can be positioned between the shower heads 760*a* through 760*c* and heaters 775*a* through 775*c*, and deposition-completed wafers 730*b* can be conveyed one at a time to the robot arm 745*a*.

According to the present invention as described above, an $O_3$-TEOS film is formed at least two different temperatures; namely at a high temperature sufficient to eliminate the base material dependence the $O_3$-TEOS would otherwise exhibit with an underlying layer, and at a low temperature at which the deposition occurs at a relatively high rate. Thus, the present invention does not compromise film quality for productivity or vise versa.

Finally, although the present invention has been described above with reference to the preferred embodiments thereof, various changes thereto and modifications thereof will be apparent to those skilled in the art. For instance, although each of the embodiments of the deposition apparatus have been disclosed as comprising a plurality of shower heads each disposed over a respective susceptor or heater, the present invention is not limited to the same. That is, any of the disclosed embodiments of the deposition apparatus can instead comprise a single shower head which covers all of the susceptors or heaters within the processing chamber.

Therefore all such changes and/or modifications are seen to be within the true spirit and scope of the invention as defined by the appended claims.

What is claimed is:

1. A method of forming an $O_3$-TEOS oxide film on a substrate, said method comprising:

providing a substrate comprising a base film for which $O_3$-TEOS oxide has base material dependence when deposited directly thereon at a first temperature;

depositing a first portion of $O_3$-TEOS oxide on said base film at a second temperature greater than said first temperature and sufficient to prevent the $O_3$-TEOS oxide from exhibiting said base material dependence with the base film; and subsequently depositing a second portion of $O_3$-TEOS oxide directly on the first portion of $O_3$-TEOS oxide film at a temperature substantially less than that at which the first portion of $O_3$-TEOS oxide is formed, whereby the rate at which the second portion of $O_3$-TEOS oxide is deposited is higher than that at which the first portion of $O_3$-TEOS oxide is deposited.

2. The method of claim 1, wherein said second temperature at which the first portion of $O_3$-TEOS oxide is deposited is within a range of 450 to 600° C.

3. The method of claim 1, wherein said first temperature at which the second portion of $O_3$-TEOS oxide is deposited is within a range of 360 to 440° C.

4. The method of claim 1, wherein the depositing of at least one of the first and second portions of $O_3$-TEOS oxide comprises producing a series of step-wise temperature changes under which the $O_3$-TEOS oxide is deposited.

5. The method of claim 1, wherein the depositing of the first and second portions of $O_3$-TEOS oxide are performed in situ.

6. The method of claim 1, wherein the depositing of at least one of the first and second portions of $O_3$-TEOS oxide comprises continuously lowering the temperature under which the $O_3$-TEOS oxide is deposited.

7. The method of claim 1, wherein the depositing of at least one of the first and second portions of $O_3$-TEOS oxide is performed under a pressure of at most atmospheric pressure.

8. The method of claim 1, and further comprising thermally treating the first and second portions of $O_3$-TEOS oxide to remove humidity therefrom and densify the $O_3$-TEOS oxide film formed by said depositing.

9. The method of claim 8, wherein the thermal treating of the first and second portions of $O_3$-TEOS oxide comprises subjecting the $O_3$-TEOS oxide to a temperature of 750 to 1200° C. for a time of 30 minutes to 2 hours.

10. The method of claim 1, wherein the first portion of $O_3$-TEOS oxide is deposited to a thickness of 1000 to 3000 Å.

* * * * *